United States Patent [19]
Tran

[11] Patent Number: 5,479,125
[45] Date of Patent: Dec. 26, 1995

[54] FREQUENCY MULTIPLYING CLOCK SIGNAL GENERATOR

[75] Inventor: John Tran, Redwood City, Calif.

[73] Assignee: Zilog, Inc., Campbell, Calif.

[21] Appl. No.: 248,965

[22] Filed: May 25, 1994

[51] Int. Cl.[6] .......................... H03B 19/00; H03K 3/017
[52] U.S. Cl. ...................... 327/119; 327/113; 327/175; 327/172; 377/47
[58] Field of Search .................................. 327/113, 114, 327/115, 116, 117, 119, 172, 173, 174, 175, 291; 377/47, 48

[56] References Cited

U.S. PATENT DOCUMENTS

| | | | |
|---|---|---|---|
| 4,613,775 | 9/1986 | Dick | 327/114 |
| 4,691,330 | 9/1986 | Takahashi et al. | 327/175 |
| 4,799,022 | 1/1989 | Skierszkan | 328/20 |
| 5,101,419 | 3/1992 | Lowe et al. | 327/175 |

*Primary Examiner*—Timothy P. Callahan
*Assistant Examiner*—Jung Ho Kim
*Attorney, Agent, or Firm*—Majestic, Parsons, Siebert & Hsue

[57] ABSTRACT

A clock signal generator for creating an output clock signal with fifty percent duty cycle and multiple of the input clock signal frequency allows generation of such a signal independent of input signal frequency and duty cycle. The generator utilizes an adjustable-delay oscillating feedback loop. A serial array of propagating delay elements measure the period of the input clock signal by triggering on successive input clock signal leading edges. This propagation lengthens the oscillating feedback loop until the output signal matches the desired frequency multiple. The feedback loop automatically adjusts according to a predetermined fraction of the period of the input clock signal. A fixed ratio of feedback loop delay to serial array delay ensures an output signal with a desired frequency multiple of the input signal frequency. Incorporation of an inverting logic gate in the oscillating feedback loop ensures a half-wave output clock signal having a fifty percent duty cycle.

10 Claims, 4 Drawing Sheets

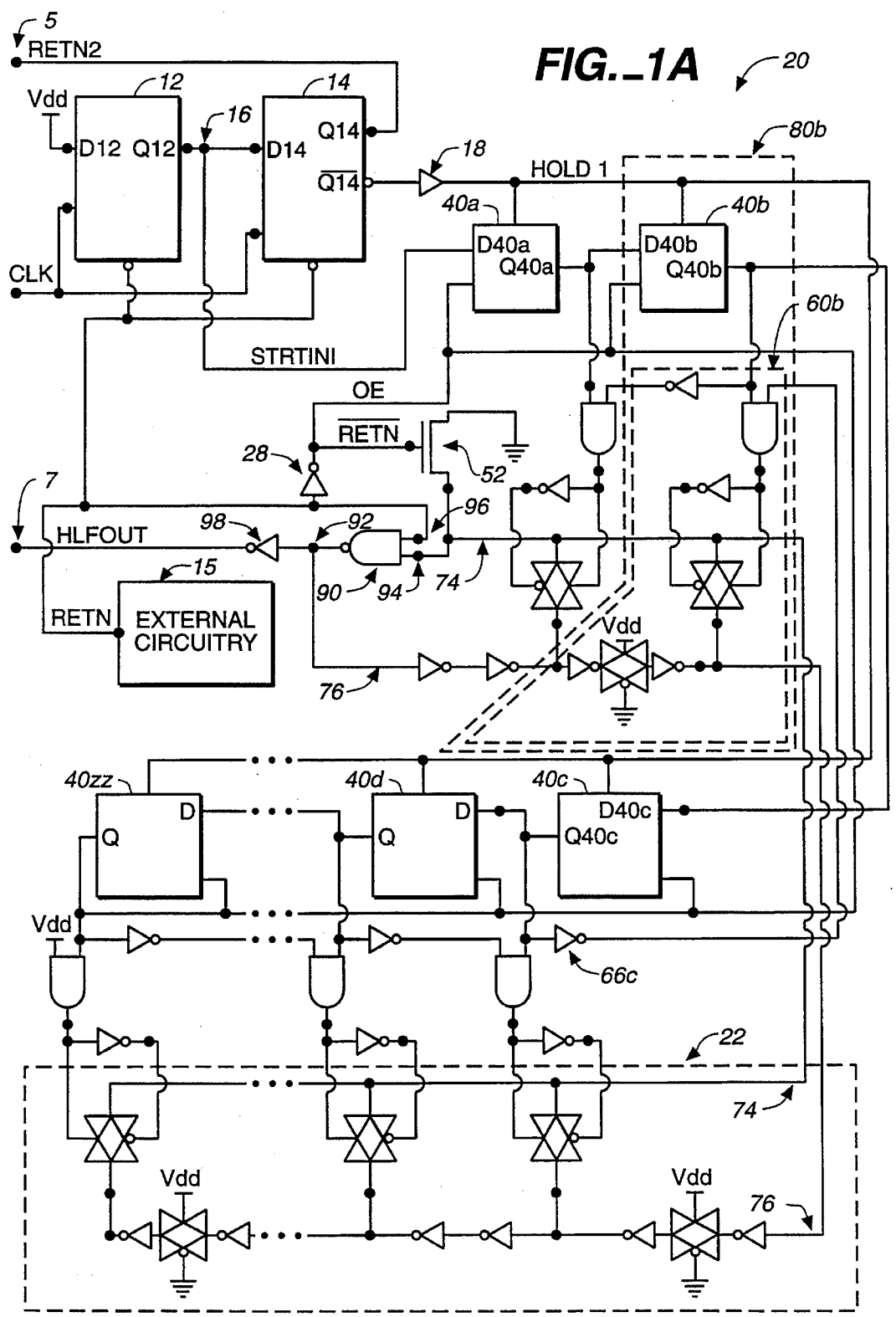
FIG._1A

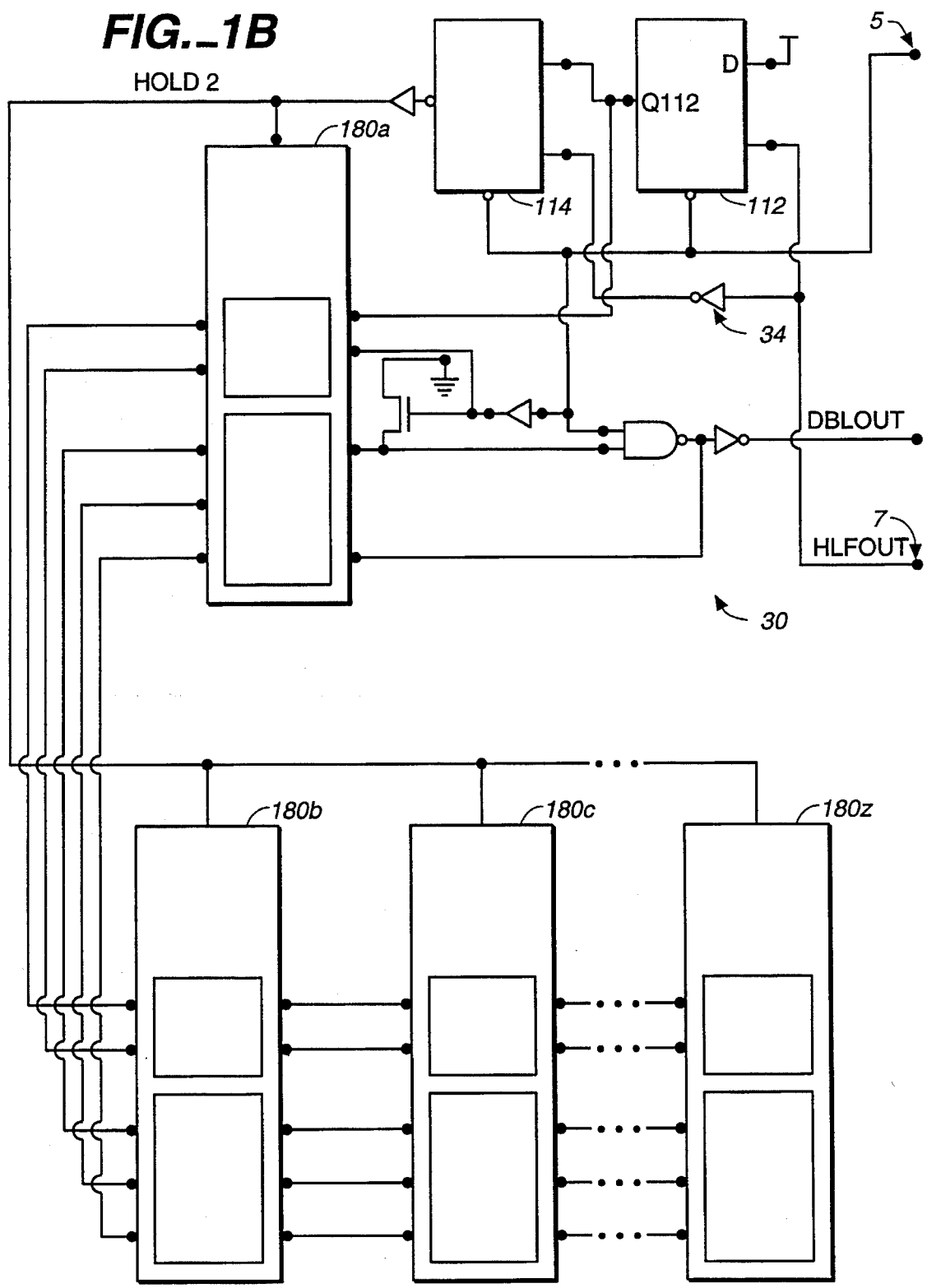

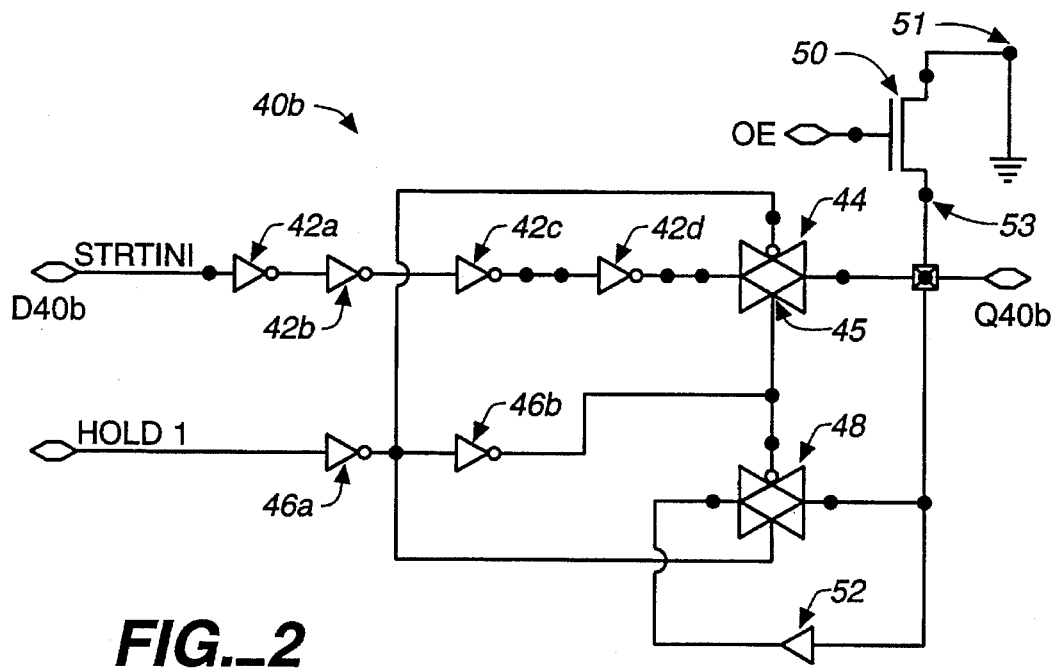
FIG._2
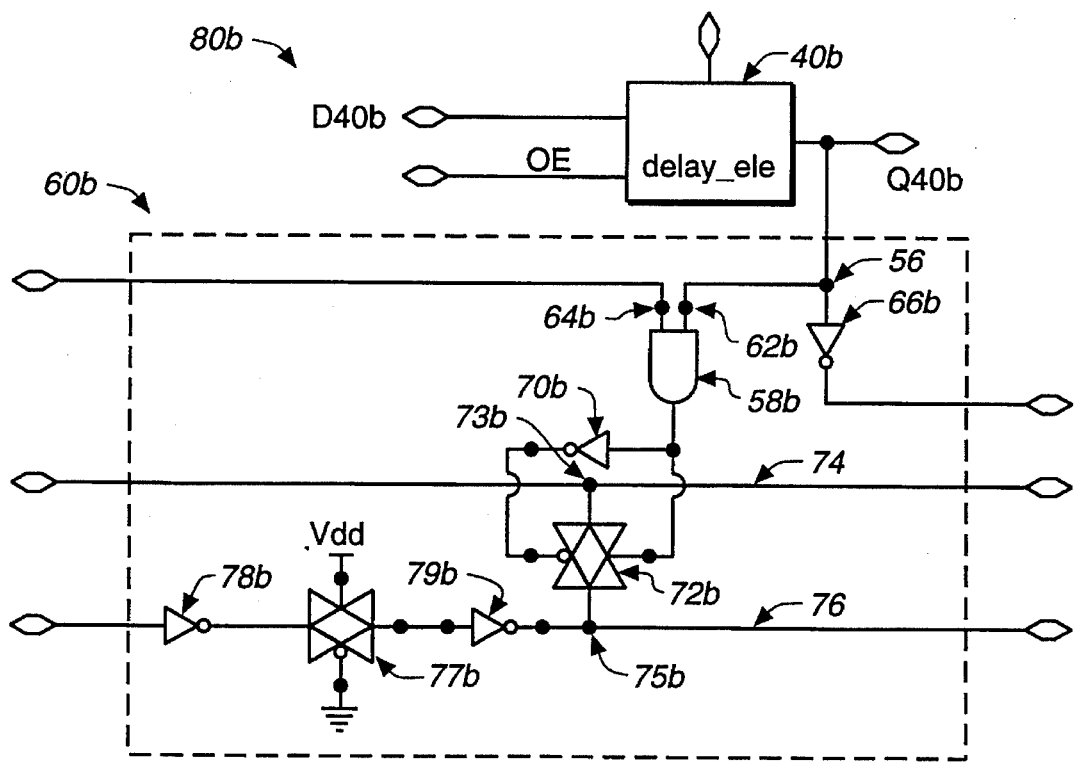
FIG._3

FREQUENCY MULTIPLYING CLOCK SIGNAL GENERATOR

BACKGROUND OF THE INVENTION

The present invention relates generally to clock signal generating circuits, and more particularly to a clock signal generator circuit which generates from an input clock signal having an input frequency and input duty cycle, an output clock signal having an output frequency which is a predetermined multiple of the input frequency and an output duty cycle which is a fifty percent duty cycle irrespective of the input duty cycle.

Frequency multiplying of clock signals is employed in computer systems for a number of reasons. For example, an accelerated clock signal may be necessary to adequately operate or receive asynchronous input from a storage device, such as a read only memory or ROM, which requires quick read and write speeds. Similarly, a frequency multiplier may be necessary to update data at a time other than the leading edge of an input clock signal pulse.

For instance, random access memory (RAM) cells often require precharging before and recharging after each read and write operation during a single clock cycle. In this example, a clock signal having double the frequency of the input clock signal is useful for initiating the precharge, read, recharge and write operations. In such an application, preferably the generated double frequency clock signal is characterized by rising edges simultaneous with the rising and falling edges of the input clock signal, and by falling edges simultaneous with the mid-points of each half-cycle of the input clock signal. A fifty percent duty cycle will ensure such an output signal.

According to the background art, frequency doubling with a fifty percent duty cycle output can be achieved by employing a plurality of cascaded inverters forming a tapped delay line. Such prior art design required the total amount of delay achieved by such delay lines to be predetermined according to the input frequency. The output of the delay line was connected to one input of an EXCLUSIVE OR gate. The input clock signal was applied to the input of the tapped delay line and to the second input of the EXCLUSIVE OR gate. By accurately specifying the delay generated by the cascaded inverters, the signal applied to the first EXCLUSIVE OR gate input is delayed from the input clock signal by one quarter cycle, causing the EXCLUSIVE OR gate to generate the appropriate double frequency output clock signal, as described above. The duty cycle of the double frequency signal output from the EXCLUSIVE OR gate is monitored by a control circuit using a counter device to increase or decrease the duty cycle as needed to ensure a fifty percent duty cycle for the output signal. Such a prior art apparatus is shown, for example, in U.S. Pat. No. 4,799,022, entitled "Frequency Doubler with Duty Cycle Monitor Means," which is incorporated herein by reference.

There are numerous disadvantages inherent in such prior art. First, such prior art is not easily adapted to creating an output signal of some frequency other than double the input frequency (e.g., three or four times the input frequency). Second, the prior art requires knowledge of the input frequency before the circuit can properly function, leaving the accuracy of the output signal's frequency vulnerable to variations in the input frequency. Third, some prior art frequency multipliers are designed such that they remain unpredictably sensitive to minor variations in temperature. If a frequency multiplier is sensitive to minor variations in temperature, the duty cycle of the output signal may vary from a desired setting, such as fifty percent. This can result in erroneous operation of the "precharge, read, recharge and write" procedure discussed above.

SUMMARY OF THE INVENTION

Accordingly, one object of the present invention is a clock signal generator without such drawbacks of the prior art.

To achieve these and other objects, one aspect of the present invention is a clock signal generator which responds to a first rising edge of an input clock signal by creating an output signal with a decreased period and accelerated frequency. The period of the output signal is gradually increased by the expansion, through the opening and closing of a serial array of feedback gates, of an oscillating feedback loop until the output signal frequency matches a desired multiple of the input clock signal frequency.

Expansion of the feedback loop depends upon the time elapsed between a first and second rising edge from an input clock signal. The first rising edge of the input clock signal triggers the propagation of a logic signal through a series of delay elements. Propagation of the logic signal through a single delay element triggers a corresponding and predetermined fractional increase in the length of the feedback loop by causing a next feedback gate to become active and a previous feedback gate to deactivate. A second rising edge from the input clock signal halts propagation of the logic signal through the delay elements and locks the feedback loop length at the predetermined fraction of the input clock signal's period. The frequency of the resulting output signal is a desired multiple of the input signal frequency. This multiple is in direct proportion to the ratio between the delay within each delay element and the delay between adjacent feedback gates.

The feedback loop output signal oscillates by negative feedback techniques employing, for example, an inverting logic gate. As a result of such negative feedback techniques, the output signal from the loop has a fifty percent duty cycle regardless of variations in device temperature. The circuit thus ensures a half-wave output signal and a frequency which matches a desired multiple of the input signal frequency.

Also according to the present invention is a method for receiving an input clock signal having first and second transition edges defining a period and frequency of the input clock signal, and generating an output clock signal having a fifty percent duty cycle and a frequency proportionally related to the input clock signal frequency. The method comprises the steps of: delaying an input signal through a first plurality of serially connected delay elements, each of the first plurality of delay elements having an input and an output; selectively connecting at least one of the outputs of the first plurality of delay elements to a common node through at least one of a plurality of gating elements, each of the gating elements having an input, an output and a gating control, preferably formed of transistors; forwarding the delayed input signal to the common node; generating a code signal responsive to the period of the input clock signal through a second plurality of serially connected delay elements, each of the second plurality of delay elements respectively connected to a plurality of encoded outputs; generating a decode signal responsive to the code signal, through a plurality of inputs respectively connected to the plurality of encoded outputs and a plurality of decoded outputs respectively connected to the gating controls; selectively activating only a selected one of the plurality of gating controls; inverting the delayed input signal through the inverting element; forwarding the inverted and delayed input signal to the input of the first plurality of delay elements; and providing the output clock signal to an inverting element after the selected one of the plurality of gating controls is activated.

Additional objects, features and advantages of the various aspects of the present invention will become apparent from the following description of its preferred embodiment, which description should be taken in conjunction with the accompanying drawings.

BREIF DESCRIPTION OF THE DRAWINGS

FIGS. 1A and 1B illustrate, as examples, first and second stages, respectively, of a clock signal generator circuit utilizing;

FIG. 2 illustrates, as an example, a schematic diagram of a delay element of the delay cell depicted in FIG. 3;

FIG. 3 illustrates, as an example, a schematic diagram of a delay cell of the clock signal generator circuit depicted in FIGS. 1A and 1B.

DETAILED DESCRIPTION OF THE PREFERRED EMBODIMENT

Figure 4:
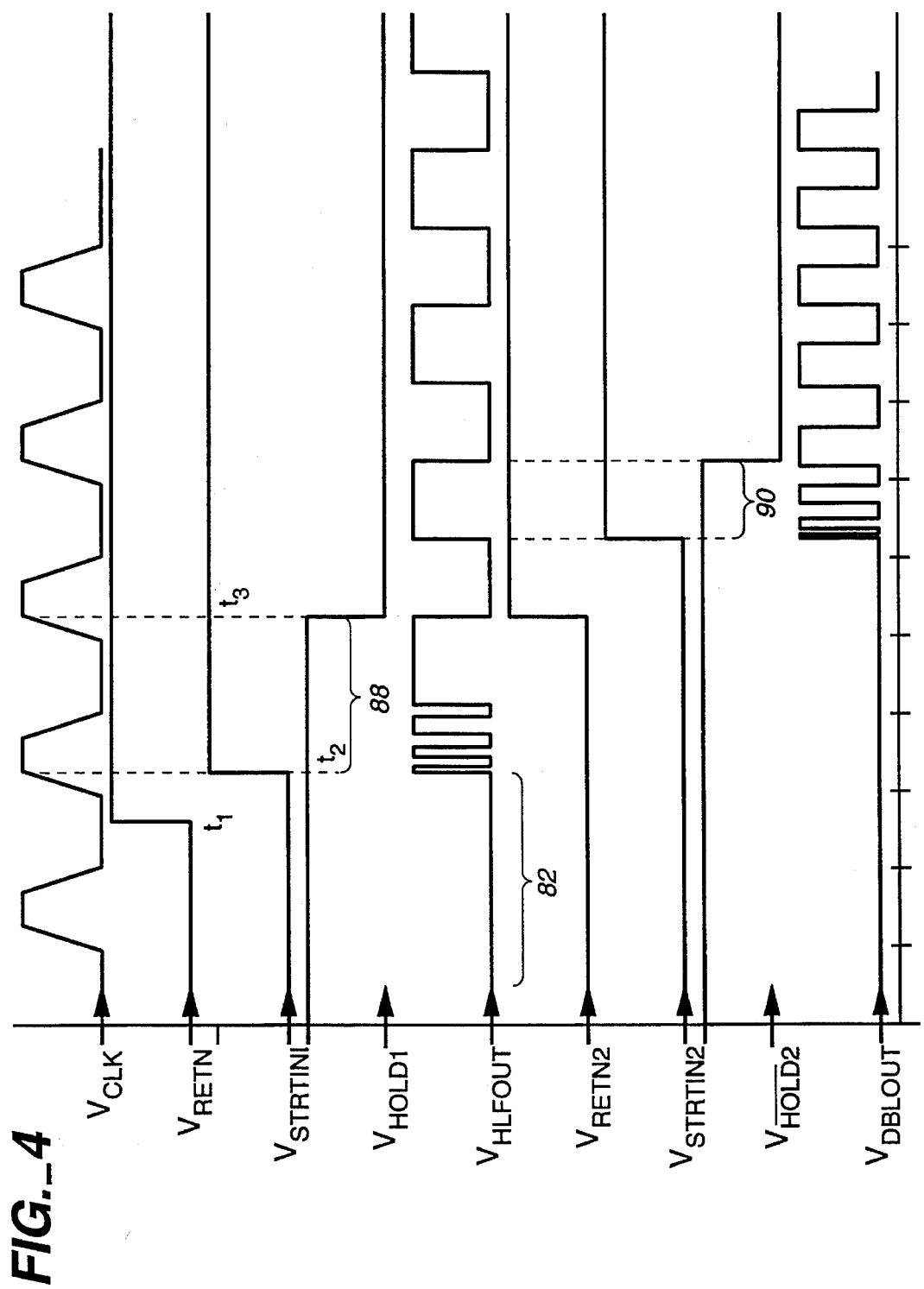
FIG. 4 illustrates, as an example, timing diagrams for the clock signal generator circuit depicted in FIGS. 1A and 1B.

FIGS. 1A and 1B illustrate first and second stages, respectively, of a clock signal generator circuit utilizing aspects of the present invention. In particular, FIG. 1A illustrates a first circuit stage 20, wherein an input clock signal CLK is connected to the clock inputs of D-type flip-flops 12 and 14. Data input D12 of flip-flop 12 receives a high logic signal $V_{dd}$. Accordingly, upon each rising edge of input clock signal CLK, signal $V_{dd}$ is "clocked" into an output Q12 of flip-flop 12.

The reset inputs of flip-flops 12 and 14 are connected to a power-up reset signal RETN. At power-up, signal RETN is set at logic low and the outputs Q12 and Q14 of flip-flops 12 and 14, respectively, are reset and remain at logic low until the signal RETN is released to logic high. Following stabilization of the input clock signal CLK, external circuitry 15 releases the signal RETN to logic high. A subsequent single rising edge from the signal CLK causes the output Q12 to register a logic high signal and to remain at logic high until the signal RETN returns to logic low.

Similarly, because input D14 is connected to output Q12, after a second rising edge is transmitted by signal CLK output Q14 will also be set to logic high. When output Q14 is set to logic high, output $\overline{Q14}$ will be set to logic low. Output $\overline{Q14}$ is connected to the input of a buffer 18. The buffer 18 produces a signal HOLD1 referred to below with respect to FIG. 2.

Output Q12 is connected to node 16 to form a delay element input signal STRTIN1. After signal CLK transmits a single rising edge, signal STRTIN1 is set at logic high until signal RETN returns to logic low. Signal STRTIN1 provides an input to cascoded delay elements 40a to 40zz.

In FIG. 2, a delay element 40b of the present invention is shown in detail. Other delay elements 40a and 40c14 40zz are similarly constructed. A series of inverters 42a to 42d are connected end to end between input D40b and a passgate 44. The number of inverters 42a to 42c must be even to ensure the output of the last inverter 42d is the same logic value as the input to the first inverter 42a. Also entering delay element 40b is signal HOLD1 originating from output $\overline{Q14}$ of D-type flip flop 14. Signal HOLD1 is connected to a second even numbered series of inverters 46a and 46b. A third signal input to delay element 40b is the output enable signal OE, originating from the output of an inverter 28 which inverts signal RETN to yield the signal OE. The signal OE is received at the gate input of a common NMOS tie-down transistor 50.

Delay element 40b functions in one of three modes (initiation mode, delayed pass-through mode or latch mode) depending on the status of the three input signals STRTIN1, HOLD1 and OE. While signal RETN remains at a logic low status, delay element 40b is in initiation mode. Signal OE remains at a logic high status, activating the tie-down transistor 50. Tie-down transistor 50 forwards a logic low signal from its source at node 51 to delay element output Q40b tied to node 53. Thus, during initiation mode all delay element outputs Q40a to Q40zz remain at logic low.

After input clock signal CLK has stabilized and power-up reset signal RETN switches to logic high, delay element 40b functions in a second mode, as a delayed pass-through element. After reset signal RETN is released to logic high, signal OE switches to logic low and the tie-down transistor 50 is deactivated, allowing output Q40b to assume whatever signal is passed through the inverters 42a to 42d and the passgate 44. A control input 45 of passgate 44 is connected to the output of the inverter 46b in such a manner that the passgate 44 is active only as long as signal HOLD1 is at a logic high. Signal HOLD1 is set to logic high at circuit initiation and does not change until the second rising edge from clock input signal CLK arrives at flip-flop 14, as explained above in relation to FIG. 1. Thus, after circuit initiation, and until a second rising edge from clock input signal CLK forces a change in signal HOLD1, delay element 40b functions as a simple delayed pass-through element for signal STRTIN1 with a total delay fixed by the number of inverters 42a to 42d placed between input D40b and output Q40b combined with the delay of passgate 44. In a preferred embodiment, there are four inverters 42a to 42d, as shown in FIG. 2.

Referring again to FIG. 1A, each delay element input D40 is connected to output Q40 of the previous delay element, originating with signal STRTIN1 at input D40a. Thus, once the logic state of output Q40a changes from logic low to logic high, a logic high signal propagates from one delay element to the next, until such propagation is halted by a change in signal HOLD1. The total period of time from the change in signal STRTIN1 at input D40a to the termination of propagation caused by a switch in the logic level of signal HOLD1 closely approximates the period of input clock signal CLK. Because the propagation process automatically begins and ends in direct response to the input clock signal CLK, prior knowledge of the input signal frequency is not required to properly multiply the frequency as desired.

The total delay caused by inverters placed within a single delay element, such as 40b, between an input, such as D40b, and an output, such as Q40b, approximates the margin of error in determining the period of input clock signal CLK. For example, returning to FIG. 2, if each inverter 42a to 42d between input D40b and output Q40b of delay element 40b delays the input signal by 0.15 ns, while the passgate 44 delays the input signal by 0.07 ns, then the maximum possible error for the period of the output frequency is 0.67 ns.

Once a second rising edge from input clock signal CLK forces signal HOLD1 to switch to logic low, delay element 40b functions in its third and final mode, as a signal latch, holding output Q40b at its last logic level. When signal HOLD1 is at logic low, the passgate 44 is deactivated and no longer allows signal STRTIN1 to pass through from inverter 42d to output Q40b. Because a passgate 48 is connected to the inverters 46a and 46b in a manner opposite to the connections of the passgate 44 to the same inverters 46a and 46b, the passgates 48 and 44 are never active at the same time. Thus, simultaneous with deactivation of the passgate 44, passgate 48 is activated by a logic low propagating through inverters 46a and 46b and originating from signal HOLD1.

The passgate 48 performs a signal latching function in that it's input is connected to its output via a buffer 52. Because output Q40b is also connected to the output of the passgate 48, the logic level of output Q40b at the time signal HOLD1 switches to logic low remains at that logic level until the circuit is again reset by a reversal in the logic level of signal RETN. If, therefore, a logic high signal has propagated to output Q40b by the time signal HOLD1 switches to logic low, then the logic level of output Q40b will remain at logic high. The function and three functional modes of delay element 40b are identical for delay elements 40a and 40c–40zz.

Referring next to FIG. 3, a detailed schematic of delay cell 80b is shown. Delay cell 80b comprises delay element 40b and feedback gate 60b. Delay element 40b and feedback gate 60b function together to lengthen feedback loop 22, shown in FIG. 1A. In a preferred embodiment, the delay established within feedback loop 22 after the second rising edge from signal CLK occurs, will equal one-half the period of the input clock signal CLK. As will be subsequently explained, a feedback loop delay equal to one-half the period of input signal CLK results in an oscillating output signal with a frequency equal to the frequency of the input clock signal CLK.

By adjusting the length of feedback loop 22, the delay cells such as 80b in FIG. 1A ensure the intermediate output signal HLFOUT of the first stage 20 is proportional to the input clock signal CLK with a 50% duty cycle. In the preferred embodiment there are twice as many inverters 42a to 42d in each delay element as there are inverters 78b and 79b, shown in FIG. 3, in each feedback gate. Thus, the length of feedback loop 22 in a preferred embodiment, once fixed, creates an oscillating signal with the same total period as the period of the input clock signal CLK. If the ratio of inverters 42 to inverters 78 and 79 in an alternative embodiment were six, then the output signal of the first stage 20 would have three times the frequency of input signal CLK.

In FIG. 3, feedback gate 60b is comprised of an AND gate 58b, inverters 66b, 70b and 78b, and two passgates 72b and 77b. The feedback gate 60b is controlled by the AND gate 58b. Delay element output Q40b is connected at a node 56 to the inverter 66b and to an input 62b of the AND gate 58b. An AND gate input 64b receives a logic signal from the output of an inverter 66c in the subsequent delay cell (shown in FIG. 1A). The AND gate 58b functions as a comparator, ensuring that the passgate 72b is active only when the logic levels at the inputs 62b and 64b are equivalent—that is, passgate 72b is active only when the logic levels of the outputs Q40b and Q40c are 1 and 0, respectively. When active, the passgate 72b allows the signal at a node 75b along a delay line 76 to pass through to a node 73b on a feedback line 74, thereby closing the feedback loop 22. When deactivated, the passgate 72b ensures the signal at node 75b will propagate further along delay line 76 to the subsequent feedback gate, thereby increasing the total delay of the feedback loop 22.

A passgate 77b, located between inverters 78b and 79b on the delay line 76, is connected to $V_{dd}$ and ground in such a way as to ensure it is always active. The passgate 77b functions as a short-term delay device to compensate for the delay caused by passgate 44 in delay element 40b. In a preferred embodiment shown in FIG. 1A, there is only one passgate 77 for every two passgates 44 of FIG. 2. This two-to-one passgate ratio ensures the total delay ratio between delay elements 40 and feedback gates 60 remains two-to-one. If a higher output frequency multiple were desired, the number of passgates 77 would decrease proportionally.

Inverters 78b and 79b are identical to inverters 42a to 42d in delay element 40b. Inverters 78b and 79b provide a desired fraction of the propagation delay caused by delay element 40b. As noted above with respect to inverters 42a to 42d in FIG. 2, the number of inverters 78 and 79 along delay line 76 must be even to ensure the output of each set of inverters equals the input.

Referring again to FIG. 1A, feedback loop 22 includes delay line 76 and feedback line 74, and passes through a plurality of feedback gates including 60a to as far as feedback gate 60zz (not shown). Feedback loop 22 feeds from an output node 92 of a NAND gate 90 and feeds to an input node 94. The output node 92 supplies an intermediate output signal to an inverter 98 which, in turn, supplies a signal HLFOUT to the second stage 30 of the multiplier circuit. The signal RETN is received by a node 96. During circuit initiation, when signal RETN is active and at logic low, the output node 92 of NAND gate 90 is fixed at logic high. Thus, signal HLFOUT is fixed at logic low. After signal RETN releases to logic high, NAND gate 90 acts as an inverter and the logic level at the node 94 determines the logic level at the output node 92 of the NAND gate 90. As a high logic level propagates from one delay element to the next, feedback loop 22 and the period of signal HLFOUT grow longer, as explained above with reference to FIG. 3. Because feedback loop 22 is self-oscillating, creating a half-wave output, once the length of feedback loop 22 is fixed signal HLFOUT will have a fifty percent duty cycle until the circuit is reset and feedback loop length adjusts to any changes in the input clock signal CLK. Moreover, the duty cycle of signal HLFOUT will not vary with minor variations in temperature to the multiplier circuit since the half-wave signal is characteristic of an oscillating inverter tied to a delayed feedback loop.

The total length and delay of the feedback loop 22 are fixed when signal HOLD1 switches to logic low. The logic level of output Q14 switches simultaneously with the switching of signal HOLD1. Output Q14 sends signal RETN2 to the second stage 30, shown in FIG. 1B, of the multiplier circuit via node 5. Thus, the delay elements of the second stage 30 remain in initiation mode, in a similar manner as explained above with respect to FIG. 2, until the output Q14 switches to logic high and signal HOLD1 fixes the period of signal HLFOUT.

Shown in FIG. 1B, the second stage 30 is similar to first stage 20 in all but three important respects. First, in second stage 30 input signals CLK and RETN no longer originate from external circuitry. The signal CLK is replaced by first stage signal HLFOUT via node 7 and the signal RETN is replaced by signal RETN2 via node 5. Second, approximately one-half the number of delay cells used in the previous stage are necessary to ensure the frequency is doubled. Third, and most important, an inverter 34 appears between inverter 98 and the clock input of a flip-flop 114. The inverter 34 is so placed to ensure that flip-flop 114 "clocks" its input signal on a falling edge of second stage clock input signal HLFOUT, instead of on a rising edge, as was the case for flip-flop 14 in first stage 20. This falling edge sensitivity ensures the delay cells of second stage 30 propagate for only one-half the period of signal HLFOUT, according to a method of frequency multiplying known to those skilled in the art. Second stage 30 is incorporated in a preferred embodiment of the present invention to minimize the number of propagating inverters within a single delay element 40, shown in FIG. 1A, and to minimize thereby the margin of error of first stage 20, as explained above.

FIG. 4 illustrates the operation of the circuit in FIGS. 1A and 1B. Signal $V_{HLFOUT}$, measured from the output of inverter 98, is shown as a square wave of decreasing frequency and increasing period. The increase in period occurs from the first moment both $V_{CLK}$ and $V_{RETN}$ are high until $V_{CLK}$ registers a second rising edge. Thus, signal $V_{HLFOUT}$ illustrates the growth of feedback loop 22 as a logic high signal propagates through delay elements 40a, 40b, etc. until a second rising edge is encountered from signal CLK.

In an example of operation, signal $V_{HLFOUT}$ is initially fixed at logic low within time 82. This fixed low signal is caused by signal $\overline{RETN}$, shown in FIG. 1A, which activates a tie-down transistor 52 connected feedback 74. When active, the tie-down transistor 52 pulls feedback line 74 to logic low, until the transistor is deactivated by a change in signal RETN at time t1.

The first change in signal $V_{HLFOUT}$ is induced after the occurrence of a single rising edge on signal $V_{CLK}$ at time t2 with signal $V_{RETN}$ at logic high. This clock pulse changes signal $V_{STRTIN1}$ to a logic high position. Once a logic high signal propagates through a delay element 40a, as explained above with reference to delay element 40b, a feedback gate 60a will activate a single stage of feedback loop 22. As feedback loop 22 grows, the period of signal $V_{HLFOUT}$ grows accordingly until a second rising edge on signal CLK occurs at time t3, triggering a drop in signal $V_{HOLD1}$. The total number of cycles signal $V_{HLFOUT}$ will go through between the first and second rising edges of signal $V_{CLK}$ may be far more than illustrated here. All such cycles may not be clearly illustrated within a figure of this scale. Also, while signals $V_{STRTIN1}$ and $V_{HOLD1}$ are shown to change only after input clock signal $VOL_K$ reaches a fully high voltage level, such response may occur at a lower level along a rising edge near times t2 or t3, depending upon the response characteristics of flip-flops 12 and 14.

It should be reiterated here that the function of multiplying an input clock signal need not be accomplished with a second stage 30 with flip-flops triggered on the rising and falling edges of an input signal. Instead, by increasing the ratio of the number of inverters 42a to 42d in FIG. 2 to the number of inverters 78b and 79b in FIG. 3, the feedback loop 22 can represent a reduced fraction of the period of input signal CLK. This reduced fraction will ensure signal HLFOUT represents a desired frequency multiple of signal CLK with a fifty percent duty cycle.

However, as explained above, an increase in the number of inverters 42 will also increase the margin of error. If, for example, eight inverters 42 with a delay of 0.15 ns each are placed within each delay element 0, the total propagation delay within each delay element will be 1.2 ns. If the input signal has a frequency of 50 MHz, or a period of 20 ns, the margin of error would be approximately ±6%, or twice the error margin with only four inverters 42a to 42d, as shown in a preferred embodiment. There exists, therefore, a need to minimize either the number of inverters 42 appearing within each delay element or the delay of each inverter. If faster inverters 42 were used in each delay element 40, second stage 30 would not be necessary. Thus, the preferred embodiment serves to minimize the margin of error encountered in multiplying the frequency of signal CLK, while employing the frequency multiplying apparatus and method described within the scope of the appended claims.

FIG. 4 also assists in distinguishing second stage 30 from first stage 20. The key distinction between the two stages can be seen in the time period 88 lapsed between the signal $V_{STRTIN1}$ and the signal $V_{HOLD1}$ as compared to the time period 90 lapsed between the signal $V_{STRTIN2}$ and the signal $V_{HOLD2}$. Because signal HLFOUT is inverted before being forwarded to the flip-flop 114 in the second stage 30, the time period 90 between the onset of propagation in the delay elements caused by signal STRTIN2 and the cessation of such propagation caused by signal HOLD2 is one-half the period of signal HLFOUT.

The remainder of second stage 30 functions in the same manner as explained above with respect to first stage 20. The resulting output signal DBLOUT represents the input clock signal CLK with a fifty percent duty cycle and a doubled frequency. If desired, succeeding stages could operate in the same manner as the second stage 30 to further increase the final output frequency.

Although the various aspects of the present invention have been described with respect to its preferred embodiment, it will be understood that the invention is entitled to full protection within the full scope of the appended claims.

What is claimed is:

1. A clock signal generator circuit for receiving a first input clock signal having first and second transition edges defining a period and frequency, and generating an output clock signal having a fifty percent duty cycle and a frequency proportional to said input clock signal frequency, said clock signal generator circuit comprising;

a first plurality of serially connected delay elements, each having an input and an output, wherein an input signal received at said input is transmitted as an output signal through said output after being delayed by a first delay period, and each successive one of said first plurality of delay elements receives as its input signal the output signal of a previous one of said first plurality of delay elements;

a plurality of gating elements, each gating element having an input, an output, and a gate control, wherein the input of each of said gating elements is connected to the output of a corresponding one of said first plurality of delay elements, and the outputs of said gating elements are connected to a common node;

an inverter having an input connected to said common node, and an output connected to the input of a first one of said first plurality of delay elements;

an encoder circuit including an input for receiving said input clock signal, a plurality of encoded outputs and a second plurality of serially connected delay elements, each of said second plurality of delay elements having first and second delay inputs and a delay output, wherein a first input signal, responsive to said first transition edge of said input clock signal, received at said first delay input, is delayed by a second delay period and transmitted as an output signal through said delay output, and, until a second input signal responsive to said second transition edge of said input clock signal, is received at said plurality of delay elements through said second delay inputs, each successive one of said second plurality of delay elements receives at its first delay input the output signal of a previous one of said second plurality of delay elements and delays said input signal by said second delay period, and wherein said plurality of encoded outputs is responsive to said delay outputs of said second plurality of delay elements; and a decoder circuit having a plurality of inputs respectively connected to said plurality of encoded outputs of said encoder circuit, and a plurality of outputs respectively connected to said gate controls of said plurality of gating elements, wherein said decoder circuit, in response to said encoded outputs, causes only a selected one of said plurality of gating elements to turn on, and said output clock signal to be provided at said output of said inverter after said selected one of said plurality of gating elements is turned on.

2. The clock signal generator of claim 1, wherein said plurality of gating elements comprise a plurality of transistors.

3. The clock signal generator of claim 1, wherein said inverter comprises a logical NAND gate.

4. The clock signal generator of claim 1, wherein said decoder circuit comprises a plurality of logical AND gates and logical NOT gates.

5. The clock signal generator of claim 1, wherein said encoder circuit further comprises a latching circuit for receiving said input clock signal and generating said first and second input signals responsive to said first and second transition edges, respectively.

6. The clock signal generator of claim 1, wherein a ratio of said first delay period to said second delay period determines a proportional relationship between said input clock signal frequency and said output clock signal frequency.

7. The clock signal generator of claim 1, wherein said output clock signal forms a half-wave.

8. A method for receiving a first input clock signal having first and second transition edges defining a period and frequency of said first input clock signal, and generating an output clock signal having a fifty percent duty cycle and a frequency proportionally related to said input clock signal frequency, said method comprising the steps of;

delaying an input signal through a first plurality of serially connected delay elements, each of said first plurality of delay elements having an input and an output;

selectively connecting at least one of said outputs of said first plurality of delay elements to a common node through at least one of a plurality of gating elements, each of said gating elements having an input, an output and a gating control;

forwarding said delayed input signal to said common node;

generating a code signal responsive to a period of said input clock signal through a second plurality of serially connected delay elements, each of said second plurality of delay elements respectively connected to a plurality of encoded outputs;

generating a decode signal responsive to said code signal, through a plurality of inputs respectively connected to said plurality of encoded outputs and a plurality of decoded outputs respectively connected to said gating controls;

selectively activating only a selected one of said plurality of gating controls;

inverting said delayed input signal through an inverting element;

forwarding said inverted and delayed input signal to said input of said first plurality of delay elements;

providing said output clock signal to an inverting element after said selected one of said plurality of gating controls is activated.

9. A method for receiving an input clock signal having a first frequency and duty cycle and generating an output signal having a second frequency which is a selected multiple of the first frequency and a fifty percent duty cycle, said method comprising the steps of;

generating a code signal responsive to a period of said input clock signal through a first plurality of serially connected delay elements;

expanding a delay loop having a second serial array of second time delay elements, each of said second time delay elements being associated with a different level of expansion of said delay loop;

proportionally relating said selected multiple to a relative number of first and second time delay elements.

10. A clock signal generator circuit for receiving a first input clock signal having first and second transition edges defining a period and frequency, and generating an output clock signal having a fifty percent duty cycle and a frequency proportional to said input clock signal frequency, said clock signal generator circuit comprising;

a serial array of first time delay elements, each of said first time delay elements having a first delay period;

an expandable array of separately activated second time delay elements including an output and connected to said serial array of first time delay elements so that each of said first time delay elements outputs an output of a different one of said second time delay elements, each of said second time delay elements having a second delay period; and a timing circuit for activating a number of said serial array of first time delay elements, said number substantially equal to a ratio of the period of said input clock signal and said first delay period, wherein a ratio of said input and output clock signal frequencies is proportional to a ratio of said first and second time delay periods.

* * * * *